(12) United States Patent
Baran et al.

(10) Patent No.: US 11,288,411 B2
(45) Date of Patent: Mar. 29, 2022

(54) B-REP MATCHING FOR MAINTAINING ASSOCIATIVITY ACROSS CAD INTEROPERATION

(71) Applicant: PTC Inc., Boston, MA (US)

(72) Inventors: Ilya Baran, Belmont, MA (US); Adriana Schulz, Seattle, WA (US)

(73) Assignee: PTC Inc., Boston, MA (US)

( * ) Notice: Subject to any disclaimer, the term of this patent is extended or adjusted under 35 U.S.C. 154(b) by 194 days.

(21) Appl. No.: 16/735,194

(22) Filed: Jan. 6, 2020

(65) Prior Publication Data

US 2020/0218835 A1 Jul. 9, 2020

Related U.S. Application Data

(60) Provisional application No. 62/788,338, filed on Jan. 4, 2019.

(51) Int. Cl.
*G06T 19/20* (2011.01)
*G06F 30/10* (2020.01)
*G06T 17/00* (2006.01)

(52) U.S. Cl.
CPC ............. *G06F 30/10* (2020.01); *G06T 17/00* (2013.01); *G06T 19/20* (2013.01); *G06T 2210/12* (2013.01); *G06T 2219/2004* (2013.01)

(58) Field of Classification Search
None
See application file for complete search history.

(56) References Cited

U.S. PATENT DOCUMENTS

| | | |
|---|---|---|
| 6,606,528 B1 | 8/2003 | Hagmeier et al. |
| 7,277,835 B2 | 10/2007 | Spitz et al. |
| 7,372,460 B2 | 5/2008 | Usami et al. |
| 8,253,726 B1 | 8/2012 | DeSimone et al. |
| 8,576,224 B2 | 11/2013 | Vandenbrande et al. |
| 8,818,769 B2 | 8/2014 | Trainer et al. |
| 8,935,130 B2 | 1/2015 | Mawby et al. |

(Continued)

OTHER PUBLICATIONS

Henderson et al., Boundary Representation-based Feature Identification, Advances in Feature Based Manufacturing, Chapter 1, Elsevier Science Ltd, 1994, online at http://citeseerx.ist.psu.edu/viewdoc/download?doi=10.1.1.33.6135&rep=rep1&type=pdf.

*Primary Examiner* — Vu Nguyen (74) *Attorney, Agent, or Firm* — Clocktower Law; Erik J. Heels; Michael A. Bartley (57) ABSTRACT

A method allows transferring references from vertices, edges, and faces of a solid or surface model to an edited model, by finding correspondences between vertices, edges, faces, and bodies of the models. The method begins by quickly finding matching bodies and aligning them, considering factors such as size, complexity, and the location of its vertices, edges, and faces. For every pair of matched bodies, it then matches exactly coincident vertices, edges, and faces. Of the remaining unmatched topology, it matches edges and faces in the new model that overlap those of the old model considerably. It uses near-neighbor structures to speed up the search for correspondences by eliminating old-new pairs of vertices, edges, and faces that do not overlap. Finally, it iteratively matches unmatched vertices, edges, and faces whose adjacent vertices, edges, and faces are in exact correspondence between the old and new models.

19 Claims, 6 Drawing Sheets

(56) References Cited

U.S. PATENT DOCUMENTS

2003/0135846 A1\* 7/2003 Jayaram .................. G06F 30/00
　　　　　　　　　　　　　　　　　　　　717/137
2007/0036434 A1　 2/2007 Saveliev
2010/0135535 A1\* 6/2010 Gutierrez ................ G06T 19/00
　　　　　　　　　　　　　　　　　　　　382/108

\* cited by examiner

B-REP MATCHING FOR MAINTAINING ASSOCIATIVITY ACROSS CAD INTEROPERATION

CROSS-REFERENCE TO RELATED APPLICATIONS

This utility patent application claims priority from U.S. provisional patent application Ser. No. 62/788,338, filed Jan. 4, 2019, titled "B-rep matching for maintaining associativity across CAD interoperation" and naming inventors Ilya Baran and Adriana Schulz.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. Copyright 2020, PTC Inc.

BACKGROUND

Field of Technology

This relates to CAD geometry processing and interoperability.

Background

The market consists of various CAD systems, and applications that interoperate with them, such as CAM, rendering tools, and analysis tools. Many of the applications have internal mechanisms for maintaining associativity (references to topology are robust under edits), but they exchange geometric data primarily as "dumb" boundary representations (B-reps) and cannot generally make use of each other's associativity mechanisms.

DESCRIPTION OF PRIOR ART

A company that markets a solution most related is Integration Guard (integration-guard.com/), which sells software for matching B-reps. Use of their solution requires manual input for bootstrapping the B-rep correspondence, and when the input has multiple bodies, a body-to-body correspondence must be provided by the user.

Some CAD systems do very basic matching on re-import. For example, SolidWorks 2016 appears to recognize curves and surfaces with identical geometry as the same.

A lot of research and engineering work has gone into the related but different problem of feature recognition (see e.g. Boundary Representation-based Feature Identification, Henderson et al., citeseerx.ist.psu.edu/viewdoc/download?doi=10.1.1.33.6135&rep=rep1&type=pdf, en.wikipedia.org/wiki/Feature_recognition). While feature recognition allows easier editing of an imported part in the CAD system that recognizes the features, it is of no help if the part is modified prior to the import: the features will often be recognized differently if the part is changed and downstream references will break.

U.S. Patents

U.S. Pat. No. 8,818,769 (issued Aug. 26, 2014, naming inventors Trainer et al., titled "METHODS AND SYSTEMS FOR MANAGING SYNCHRONIZATION OF A PLURALITY OF INFOMRATION ITEMS OF A COMPUTER-AIDED DESIGN DATA MODEL") describes a method for multiple CAD and application systems maintaining associativity, but relies on a shared differential data model (which mainstream CAD applications do not currently support) rather than the ability to infer changes to a neutral B-rep format (like STEP, or Standard for The Exchange of Product model data, which is an industry standard).

U.S. Pat. No. 7,277,835 (issued Oct. 2, 2007, naming inventors Spitz et al., titled "BOUNDARY REPRESENTATION PER FEATURE METHDS AND SYSTEMS") details a solution of exporting B-reps on a feature-by-feature basis within parametric CAD, allowing reconstruction within a second CAD system. This requires B-reps for every feature rather than the industry standard B-rep for a model.

U.S. Pat. No. 8,576,224 (issued Nov. 5, 2013, naming inventors Vandenbrande et al., titled "METHODS AND APPARATUS FOR AUTOMATED PART POSITIONING BASED ON GEOMETRICAL CONSTRAINTS") describes a method for finding a rigid motion relating two similar B-reps. While the method relies on matching topology, it requires planar faces, cannot handle large modifications of the model, and only produces a rigid motion, rather than a full topological correspondence, as would be necessary for preserving associativity.

None of the above provides a B-rep associativity preservation method that is robust to geometric changes, works automatically, and handles multiple bodies. What is needed, therefore, is a solution that overcomes the above-mentioned limitations and that includes the features enumerated above.

BRIEF SUMMARY

The solution centers around a method for finding corresponding portions of an original and an updated boundary representation, or B-rep (CAD model in a neutral format). Such a method allows references to the original B-rep to be mapped to the new B-rep, preserving associativity. For example, person A modeling a phone in one CAD system would be able to collaborate with person B modeling a car holder for that phone (and using the phone model for reference) in another CAD system—when the phone model is modified, person A would share the updated phone B-rep with person B, whose CAD system, using this method, would migrate the references to the updated phone.

The method incorporates multiple stages and matching strategies, making it robust to various kinds of changes. It includes a body-to-body correspondence pass, allowing it to work with assemblies, not just parts. It can run fully automatically, or it can incorporate user input for a more accurate match.

FEATURES AND ADVANTAGES

The solution allows a first parametric CAD system to persistently reference faces, edges, and vertices of a model created by a different CAD system. Specifically, when the model is edited in the different CAD system, references from the first CAD system can be updated to the new model, at least in regions unaffected by the edits.

The method is efficient, allowing interactive use with large models. A model with multiple bodies totaling around 4000 faces can be processed in about 10 seconds.

The method supports matching models consisting of multiple bodies to each other, allowing use with assemblies. The method does not assume that the order or number of new bodies corresponds to the order of old bodies; it determines which body pairs are likely to match based on a number of criteria. It also does not assume the bodies are in the same world position, automatically determining the most likely translation for the bodies to align.

The method allows for user input, intelligently using user-provided correspondences between old and new topology to compute more correspondences automatically. For example, information about which bodies correspond can be used to correct mistakes by the automatic body matching step and improve the face-to-face and edge-to-edge matching.

BRIEF DESCRIPTION OF THE DRAWINGS

In the drawings, closely related figures and items have the same number but different alphabetic suffixes. Processes, states, statuses, and databases are named for their respective functions.

DETAILED DESCRIPTION, INCLUDING THE PREFERRED EMBODIMENT

In the following detailed description, reference is made to the accompanying drawings which form a part hereof, and in which are shown, by way of illustration, specific embodiments which may be practiced. It is to be understood that other embodiments may be used, and structural changes may be made without departing from the scope of the present disclosure.

Terminology

The terminology and definitions of the prior art are not necessarily consistent with the terminology and definitions of the current disclosure. Where there is a conflict, the following definitions apply.

FACES, EDGES, VERTICES, and BODIES are collectively called TOPOLOGY and refer to the well-known portions of a boundary representation (B-rep). Bodies are made up of other topology elements (faces, edges, vertices).

Vertices, edges, and faces have associated POINTS, CURVES, and SURFACES, respectively.

A face is bounded by zero or more LOOPS, each consisting of vertices and edges.

A MODEL is a collection of bodies.

A MATCHING is a partial correspondence between the topology of two models.

Vertices correspond to vertices, edges correspond to edges, etc.

Operation

Computer aided design (CAD) operates as a dedicated software application running on a computer, or through a distributed model with a CAD software interface displaying on a computing device and communicating with one or more other computers executing CAD software computations. A CAD user interface device is used for a human user to interact with the CAD program. The CAD interface device includes an output display for rendering designs in progress and options for altering the design, and input controls to interact with the rendered display. Examples may include, but are not limited to, desktop computers, tablets, or mobile phones. The computing device operating the CAD software computations may be the same device as the interface device, or another separate computer or distributed computing solution connected over a network to the interface device. The CAD software computation device includes one or more processors, memory, and access to storage sufficient to compute and update changes to a design as manipulated by a user interacting with the CAD interface device.

One example preferred system is Onshape CAD, as detailed in U.S. patent application Ser. No. 15/052,418 ("Multi-User Cloud Parametric Feature-Based 3d CAD System", filed Feb. 24, 2016, naming inventors Hirschtick et al.), which is hereby fully incorporated by reference. The CAD software program may be run entirely one a single computer system, or across multiple computer systems as a distributed or cloud software solution.

In normal operation of CAD software, models are developed and exported as B-reps, and stored and exchanged as standard files. B-reps may then be imported into other CAD systems, or other programs which can take CAD input such as computer-aided manufacturing (CAM), rendering tools, and analysis tools. The import may occur on the same or a different user interface device. B-rep export is used as an industry standard format for exchanging models between different CAD or CAD-related software systems (such as from Onshape to a non-OnshapeCAD software system).

Generation of the B-rep export, and first-time import into a second system, may be performed as already standard in existing CAD software. As the B-rep export is a representation of boundary geometries of a model, the export lacks reference data (feature or constraint information) that may be stored in the originating CAD model. Such features and constraints may include degrees and freedom of motion, and relationships between different parts within the model. Some CAD systems store reference data associated with the B-rep, but there is no industry standard format for such reference data, so it is typically only importable within the same CAD software platform. Once imported into a second system, feature and constraint information may be manually or automatically configured (this configuration after initial import is outside the scope of this disclosure). Also, the model may be edited within either CAD platform (CAD on the first system, or CAD on the second system). Once changes are made by edits within one CAD platform, to get the changes to the other CAD platforms a new export and import of a B-rep of the changed model is needed. On this later import (of changes made to a model already existing within the CAD platform), a matching may be applied in order to preserve features and constraints previously configured. Note all of the above may be extended to more CAD platforms and systems than just two—of focus is the matching applied within a CAD platform when importing a B-rep update to a model already existing within that CAD platform.

To perform matching, the CAD platform software may operate a software function, module, or separate program (hereafter collectively referred to as function) to create a matching. The function may be input, or have access via memory or disk storage, two models. One of the models has previously been edited within the CAD platform software, and thus may have existing feature and constraint information. The other model is generated from a B-rep, intended to be of a changed or different version of the model previously edited within the CAD system.

Optionally, a user may also input a matching. Typically this is done through the user interface of the CAD software, which may display the model already in the system and the B-rep being imported. The user may then use user interface controls to select corresponding edges, vertices, faces, or bodies. Matchings may be stored in any relevant data structure within the CAD software, such as a map or dictionary associating entities of the imported B-rep with entities of the existing CAD model. With a user-input matching, elements matched by the user may be automatically considered matched, reducing the computations needed and providing a basis for adjacency matching.

Figure 1:
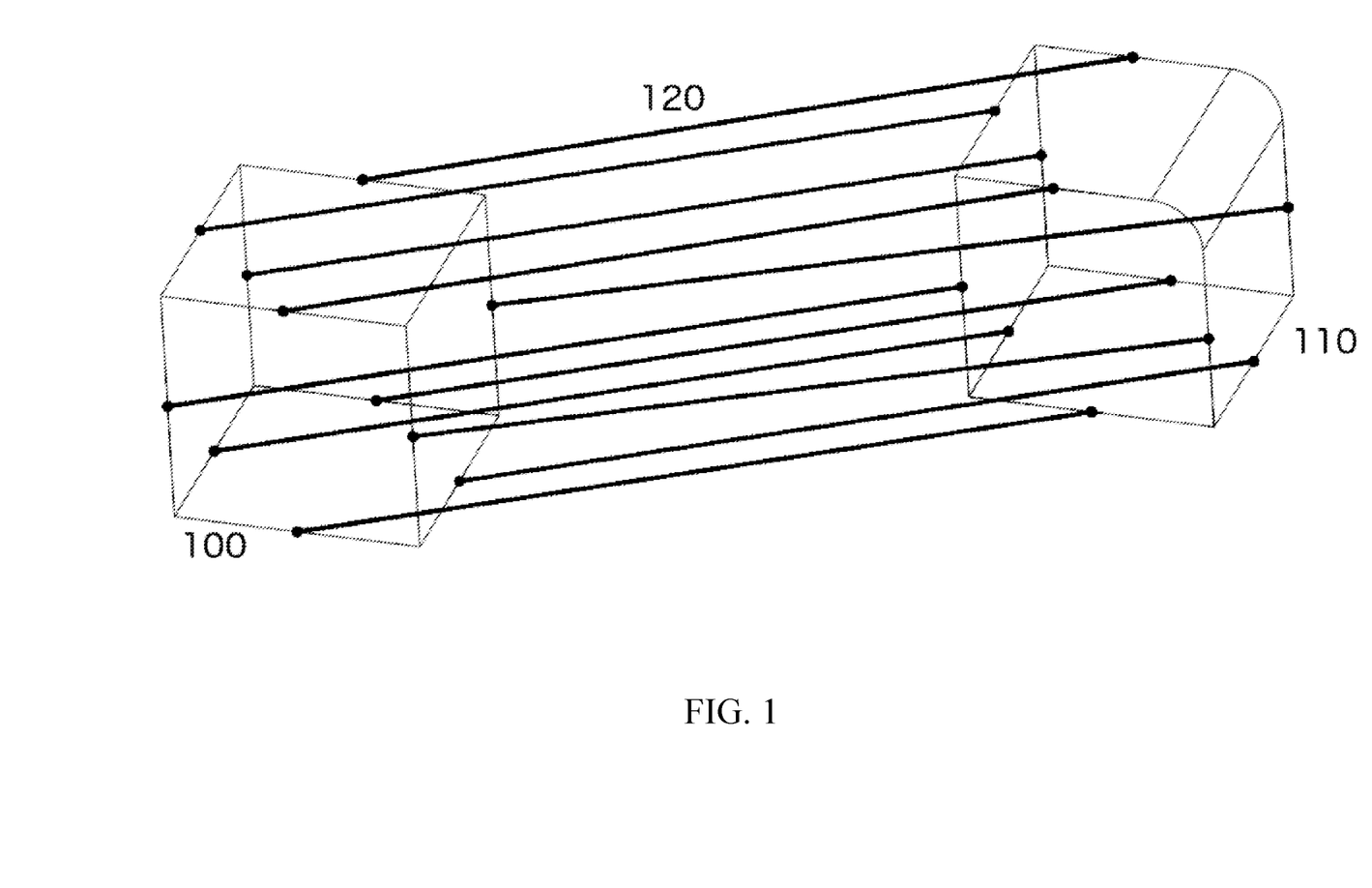
FIG. 1 is an illustration of a portion of the output of the method on two simple models: a cube and a cube with a fillet. The connecting lines connect edges that have been matched between the two models.

The result, or output, of the function is a matching. Referring to the example illustrated in FIG. 1, an existing cube 100 is matched based on an updated B-rep creating a cube 110 with a fillet. The output of the function maps edges of cube 100 to edges of cube 110, and may be visually illustrated within the CAD software by lines 120.

Figure 2:
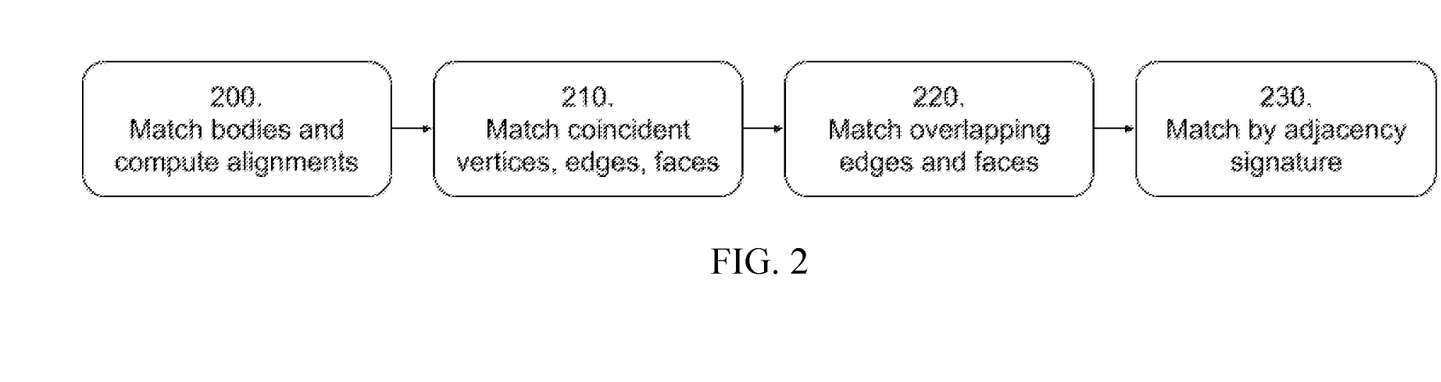
FIG. 2 is a flowchart illustrating of the overall method.

The function first finds matching bodies and translations between them. Referring also to FIG. 2, the function first finds pairs matching bodies 200, and then matches vertices 210, matches edges 220, and matches faces 230 for each matching body pair.

Matching Bodies

If the old and new models have exactly one body each, the function considers these bodies matched. Otherwise, the function executes the following:

To find matching bodies, a signature is computed for each body, so that similar bodies will have similar signatures. In a preferred embodiment, the signature is a vector of five numbers: the volume of the body, the length of the diagonal of the axis-aligned bounding box of the body, and the number of vertices, number of edges, and number of faces. For every pair of an old and a new body, the signatures are compared and if they are found to be similar (for example, as defined in the next paragraph), the pair of bodies is considered a candidate match.

While different similarity determinations may be used, in a preferred embodiment the function considers two signatures similar if their volumes are within a factor of ten of each other, the bounding box diagonals are within a factor of two of each other, the higher count of vertices must be at most one hundred plus twice the lower count, and the same higher count of edges and faces must each be at most one hundred plus twice the lower count.

The function sorts the candidate matches by a similarity score. While different similarity scoring may be used, in a preferred embodiment the similarity score is a combination of ratios of the volumes, bounding box volumes, entity counts, and the prior-to-translation ratio of the overlap volume of bounding boxes to the volume of the smaller bounding box (so that if bodies are not translated, their positions participate in the match). The function processes the candidate matches with the highest similarity first.

Figure 3:
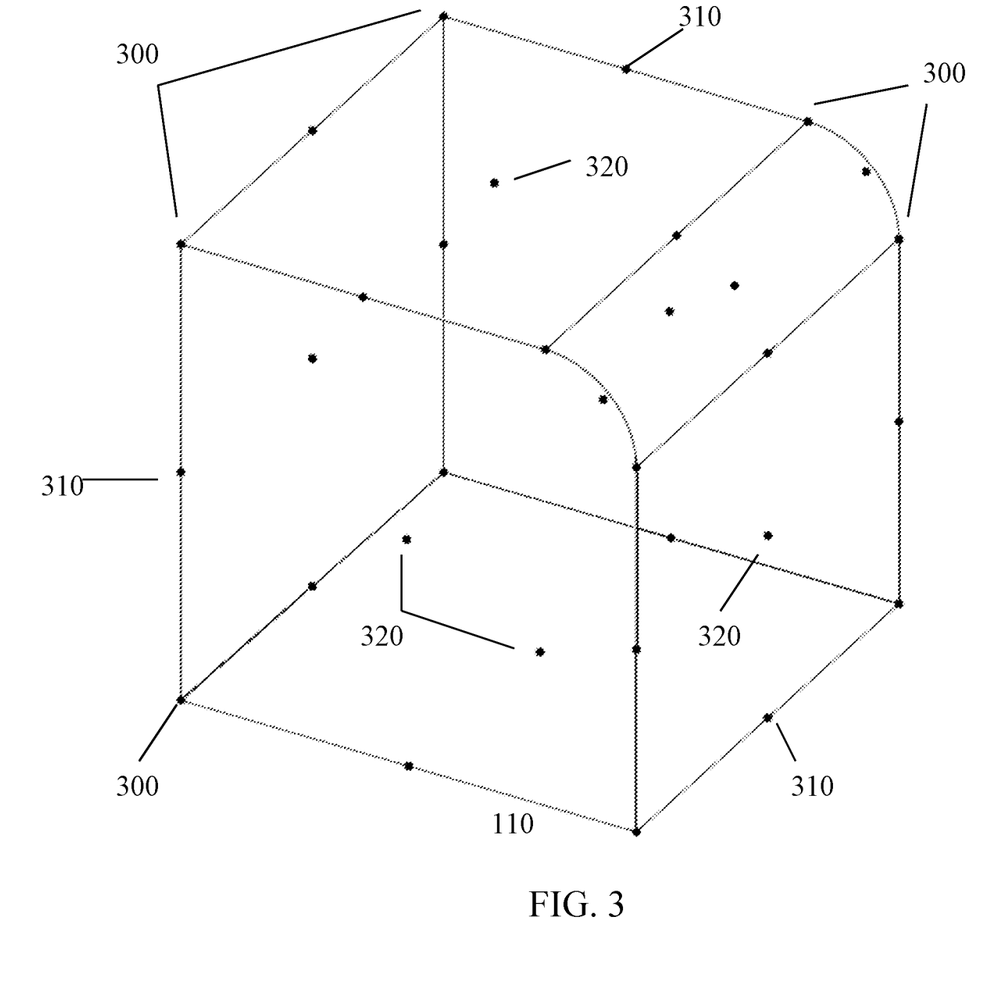
FIG. 3 illustrates how a body is converted to a point cloud (solid points) to compute alignment.

For every candidate pair of bodies in which neither body has already been matched, the function computes a translation to align them. Referring also to FIG. 3, each body, such as cube 110 with a fillet, is represented as a point cloud consisting of all of the vertices 300 and all of the centroids 310 of edges and the centroids 320 of faces of the body (additional points are visible in FIG. 3 but unlabeled for clarity, and correspond with one of vertices 300, centroids 310 of edges, or centroids 320 of faces). A three dimension translation vector is then found that aligns as many points as possible, up to a tolerance (in a preferred embodiment, the tolerance is 0.00005). To find this vector, the function uses a randomly rotated coordinate system. For each of the three axes of this coordinate system, the two point clouds are projected on that axis and the resulting one dimension alignment problem is solved. For the one dimension alignment problem, if either point cloud is small (less than one hundred points each), all pairwise differences are put into a vector, sorted, and the value that appears most frequently is found—that is the best alignment. If both point clouds are large, points are sampled from each, and pairwise differences are computed of the sampled points. Differences that appear at least a certain number of times are identified and tested on the full point clouds. In a preferred embodiment, a sampling probability is picked so that if the best alignment aligns at least n/2 points (where n is the size of the smaller point cloud), then it is expected to align at least fifty points in the sampled point clouds, and differences are tested that appear at least twenty-five times.

Each time a pair of bodies is found such that a translation vector aligns more than half of the points of their associated point clouds, the body pairing is recorded as "matched" with that translation vector. After iterating through all candidate matches, a second pass is made, iterating over candidate matches (again, from most to least similar). Any candidate matches where the bodies are not already matched, and the volume of their bounding box overlap is at least half the volume of the smaller bounding box, are recorded as matched with a zero translation vector.

Matching Vertices, Edges, and Faces

For each pair of bodies that have been matched, the function temporarily translates the old body by the identified translation, so that the old and new bodies are aligned. Vertices, edges, and faces are then matched in stages.

Stage 1: Exact Match

Every vertex, edge, or face, is considered matched if the new topology coincides with the old topology up to the matching tolerance (0.00005). To speed up processing, rather than checking every pair of old and new topology, the function only checks those whose centroids match. A 3D grid-based near neighbor structure is used to find the matching centroids.

Stage 2: Overlap Match

The function looks for unmatched edges whose associated curves are identical in the old and new model. For each pair of such edges, the function computes their overlap length, and if the overlap is a large enough fraction (preferably 80%) of the smaller of the old and new lengths, the pair is considered matched. Similarly, faces with identical surfaces whose overlap area is at least 80% of the smaller face area are considered matched.

To make the function practical for large, complex assemblies, it avoids searching over every pair of old and new edges.

For each edge in the old model whose curve is a line, the function computes a 6D vector to represent this line. It is the concatenation of the 3D point on the line that is closest to the origin and the 3D unit direction of the line. This representation is unique up to the sign of the direction vector and similar lines are represented by close 6D vectors (other representations with these properties are possible, such as Plucker coordinates). This representation is stored in a 6D grid-based near neighbor structure. For each new model edge whose curve is a line, the function looks up the old model edges with lines identical (up to the matching tolerance) in the near neighbor structure, doing the lookup twice for the two possible signs of the direction vector. For each edge found, the function checks that the bounding box of the old edge overlaps the bounding box of the new edge, prior to computing the exact overlap length.

For edges whose curves are circles, the function applies a similar method, using a 7D representation (center, unit normal vector, radius). For ellipses, an 11D representation is used (center, normalized normal, normalized major axis, major radius, minor radius) along with four lookups (as both the normal sign and the major axis sign are ambiguous). For all other curve types, the function only checks bounding box overlap before proceeding to the full overlap computation.

Similarly, for faces, a lookup is used based on a vector representation for planar, cylindrical, conical, spherical and toroidal faces (4, 7, 7, 4, and 8 dimensions, respectively).

Stage 3: Adjacency Match

For every matched pair of vertices, edges, and faces, an arbitrary unique positive integer is assigned, called the match index. For each unmatched old vertex, edge, and face, an adjacency signature is computed, represented as an array of numbers, as follows.

Adjacency Signature Computation

Figure 4:
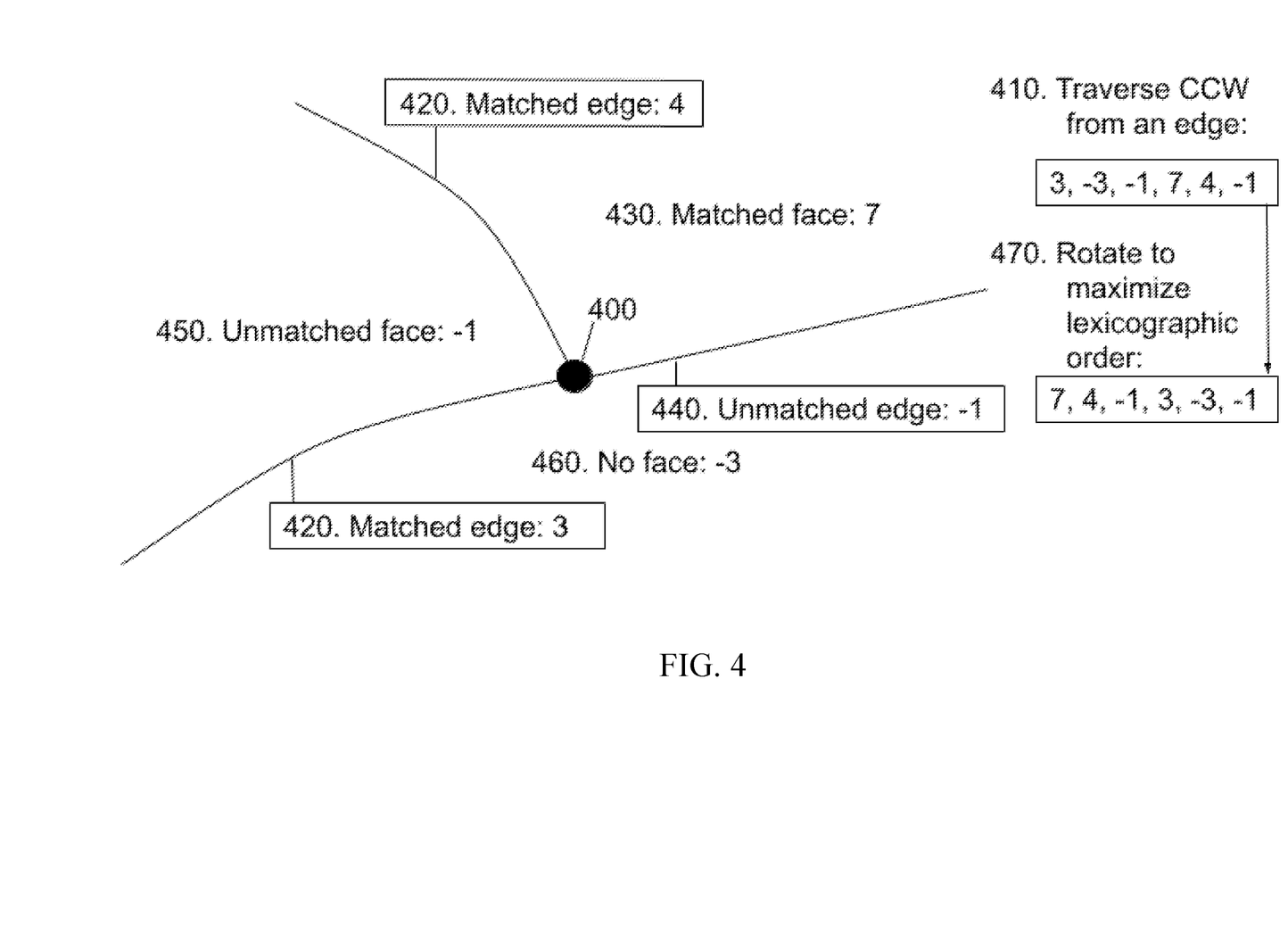
FIG. 4 is an illustration of how the adjacency signature of a vertex (represented by the black circle) is computed. The vertex is adjacent to two faces and three edges.

To compute the signature for a vertex, and as illustrated in the example shown in FIG. 4, the adjacent edges and faces are traversed around the vertex 400 in counterclockwise order 410. For each matched edge 420 or face 430, the match index is recorded. For each unmatched edge 440 or face 450, the special value −1 is recorded. If a face is missing 460 because the vertex is on the boundary of a sheet body, the special value −3 is recorded. The recorded values are assembled into an array. To avoid the ambiguity of which edge or face to start with, a starting point is selected that results in the greatest array, compared in lexicographical order 470.

Figure 5:
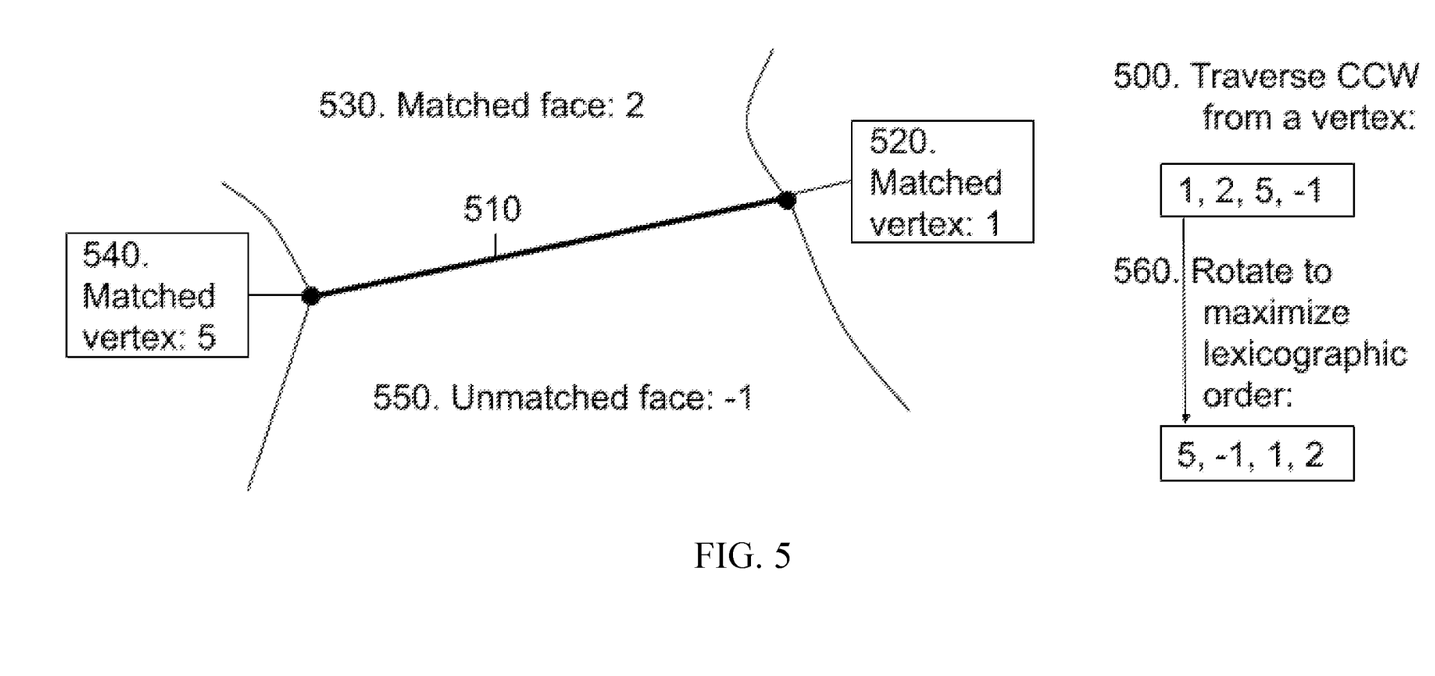
FIG. 5 is an illustration of how the adjacency signature of an edge (represented by the bold line) is computed.

Analogously, to compute the adjacency signature for an edge, and as illustrated in the example shown in FIG. 5, the two adjacent vertices and the one or two adjacent faces are traversed 500 around the edge 510. The first vertex match index 520 (−1 if unmatched), the match index of the face 530 that is on the right when moving along the edge from the first vertex (−1 if unmatched, −3 if no face), the second vertex 540 match index, and the other face 550 match index are recorded. Again, a starting point is selected 560 for the signature that maximizes lexicographical order.

Figure 6:
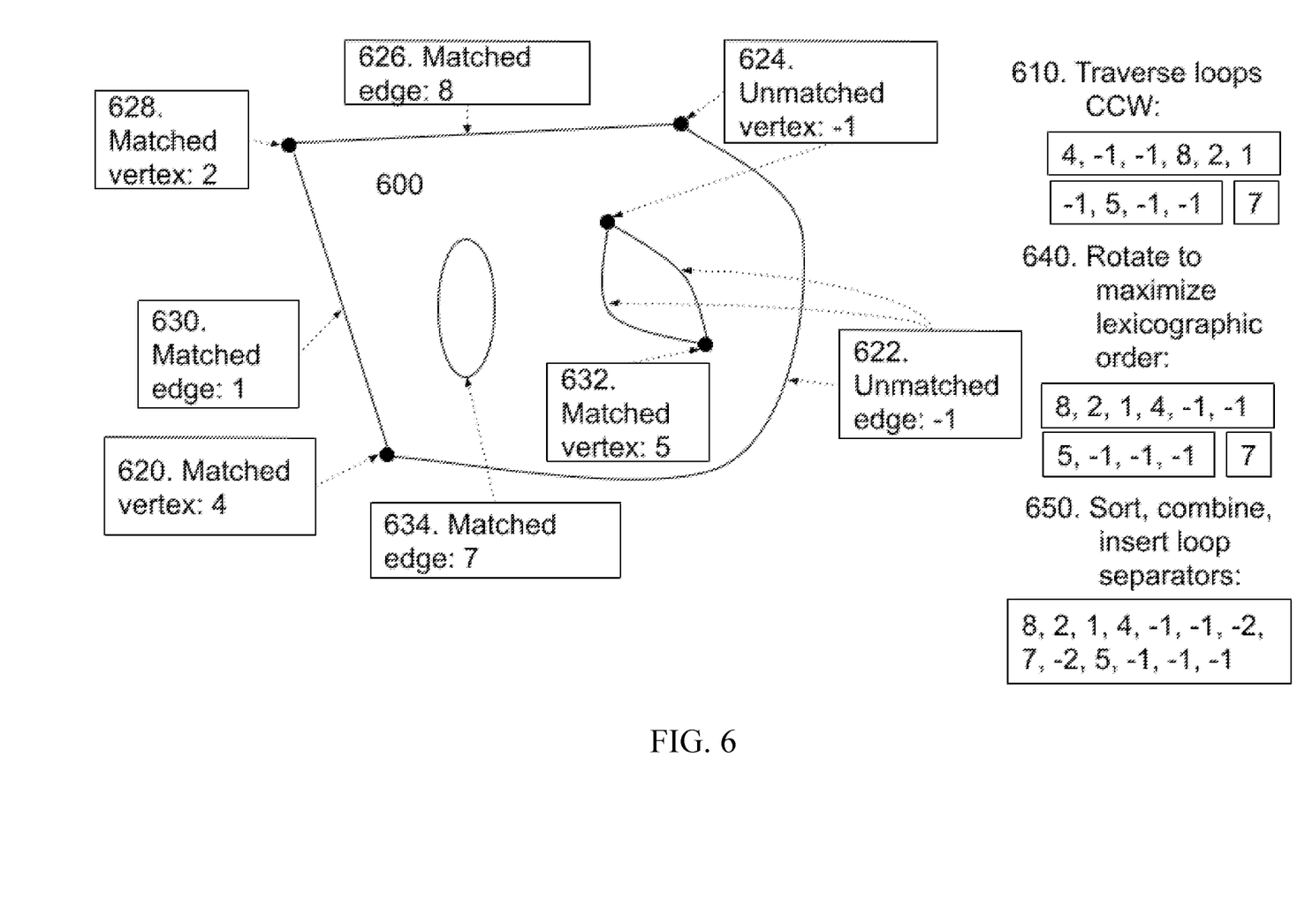
FIG. 6 is an illustration of how the adjacency signature of a face with three loops is computed.

To compute the adjacency signature of a face, and as illustrated in the example shown in FIG. 6, all of the loops that bound the face 600 are considered. In the illustrated example, three loops bound the face—one being the loop around the edge of the face, and the other two interior loops bounding gaps within the face. For each loop, a the loop signature is computed by traversing it 610 and recording match indices of edges and vertices. For example, in the illustrated example the exterior loop has a vertex 620 (with match index 4), followed by an unmatched edge 622 (match index −1), an unmatched vertex 624 (match index −1), matched edge 626 (match index 8), matched vertex 628 (match index 2), and matched edge 630 (match index 1). One interior loop has an unmatched vertex 624 (match index −1) followed by and unmatched edge 622 (match index −1), matched vertex 632 (match index 5), and another unmatched edge 622 (match index −1). The other interior loop has just a single oval matched edge 634 (match index 7) with no vertices. Each loop signature is rotated 640 to start with the edge or vertex in each loop that results in the greatest lexicographical order for the signature array. The loop signatures are then sorted 650 in lexicographical order, and concatenated into a single adjacency signature, splicing a special value, such as −2, to separate the loops.

Signature Matching

The adjacency signatures of the old topology are stored in a hash table. Adjacency signatures are computed for all new topology and put them in a priority queue based on the ratio of matched to unmatched entities (so that the function matches based on more matching adjacency first). While the priority queue is not empty, the top new topology adjacency signature is taken from the priority queue. If it corresponds to a unique old topology adjacency signature, the signatures are considered matched. The adjacency signatures of all adjacent unmatched new and old topologies are then updated (putting the old topology into the hash table and the new topology back in the priority queue). When the priority queue is empty, if a new topology is encountered that matches multiple old topology signatures, the priority queue is recreated and process repeated, and so on until no further progress is made.

With matching elements identified, features and constraints may be automatically applied to the model generated from the changed B-rep. In a preferred embodiment, when a model is first imported, persistent identifiers (e.g., sequential integers) may be assigned to all of its topology and references to this model from features or constraints are recorded in terms of these identifiers. When a new B-rep of the model is imported with matching topology identified, new topology that has corresponding old topology may be assigned same persistent identifier, while new topology without corresponding old topology may be assigned new persistent identifiers. This way features and constraints that reference the old model may automatically resolve to the corresponding topology in the new model. In an alternate embodiment, the references themselves may be mapped from old values to new values using the matching results.

Other Embodiments

A lot of variation is possible without sacrificing, and even possibly improving, effectiveness.

Body matching may also consider rotations, not just translations for alignment. Iterative closest point, or other similar inexact algorithms may be required for this. For translations only, finding the most frequent pairwise difference in one dimension using fast Fourier transform (FFT) convolutions may allow alignments to be computed faster and deterministically.

Multiple candidate alignments may be computed, rather than just one, for a pair of matching bodies. An example where this would be beneficial is a dumbbell, where the new model has a longer handle than the old model: the two ends need different translations for stages 1 and 2 of vertex/edge/face matching to work well.

Additional stages may match more topology: for example, one additional stage may match approximately based on adjacency signature, matching old and new faces where the signatures are allowed to differ, but only on relatively short edges and vertices adjacent to these short edges. Another additional stage may match edges or faces that are uniquely large or complex and have a similar geometry, without matching exactly.

Additional stages may feed back into prior stages; for instance, if faces are matched by an approximate adjacency matching stage, the exact adjacency matching stage may be re-run. Vertex/edge/face matching stages may also feed back into the body matching stage: if two body matches (or alignments) were close and vertices/edges/faces match poorly on the the chosen body match, vertex/edge/face matching may be run on the other body match.

Other embodiments may have different body signatures, different criteria for comparing them, or a different alignment algorithm (e.g., matching planes, cylinders, etc. without going to a point cloud).

The specific quick rejection mechanisms may be different for coincidence matching (stage 1): for example, bounding boxes may be used rather than centroids. Quick rejection mechanisms for approximate overlap (stage 2) may also be different. Different near-neighbor data structures may be used to accelerate lookups for centroid alignment, as well as in more than three dimensions for surface geometry matching. Different canonical surface representations may also be used (for example, coefficients in the equation defining cone, ellipsoid, cylinder, etc., viewed as a quadric).

Different adjacency signatures may be used, a different priority for adjacency matching chosen, and additional criteria may be used for rejecting potential adjacency-based matching.

The methods and systems described herein may be implemented in hardware, software or any combination of hardware and software suitable for a particular application. The hardware may include a general purpose computer and/or dedicated computing device or specific computing device or particular aspect or component of a specific computing device, including mobile computing devices such as, but not limited to, cell phones, mobile phones, mobile personal digital assistants, laptops, palmtops, netbooks, or tablets. The processes may be realized in one or more microprocessors, micro-controllers, embedded micro-controllers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals.

The methods and systems described herein may be deployed in part or in whole through network infrastructures. The network infrastructure may include elements such as, but not limited to, computing devices, servers, routers, hubs, firewalls, clients, personal computers, communication devices, routing devices and other active and passive devices, modules and/or other components. The computing and/or non-computing device(s) associated with the network infrastructure may include, apart from other components, a storage medium such as, but not limited to, flash memory, buffer, stack, RAM, or ROM.

The computer software described herein may be stored and/or accessed on machine readable media that may include: computer components, devices, and recording media that retain digital data used for computing for some interval of time; semiconductor storage known as random access memory (RAM); mass storage typically for more permanent storage, such as, but not limited to, solid state drives, optical discs, forms of magnetic storage like hard disks, tapes, drums, cards and other types; processor registers, cache memory, volatile memory, non-volatile memory; optical storage such as CD, DVD; removable media such as flash memory, floppy disks, magnetic tape, standalone RAM disks, removable mass storage, other computer memory such as, but not limited to, dynamic memory, static memory, read/write storage, mutable storage, read only, random access, sequential access, location addressable, file addressable, content addressable, network attached storage, or a storage area network.

It is to be understood that the above description is intended to be illustrative, and not restrictive. Many other embodiments will be apparent to those of skill in the art upon reviewing the above description. The scope should, therefore, be determined with reference to the appended claims, along with the full scope of equivalents to which such claims are entitled.

What is claimed is:

1. A method within software operating computer aided design (CAD) comprising:
    importing a boundary representation (B-rep) of a CAD model as a new model;
    selecting an existing CAD model within the CAD software as an old model;
    computing one or more rigid motion transformations to align topology of the old model with topology of the new model by:
        identifying bodies within each model;
        computing a signature for each body as a vector of five numbers including a volume of the body, a diagonal length of an axis-aligned bounding box of the body, a number of vertices of the body, a number of edges of the body, and a number of faces of the body, such that similar bodies will have similar signatures;
        comparing between pairs of bodies taken one body from the old model and one body from the new model, and if signatures are similar based on:
            their volumes are within a factor of ten of each other,
            their bounding box diagonals are within a factor of two of each other,
            a higher count of vertices of one signature is at most one hundred plus twice the count of vertices of the other signature,
            a higher count of edges of one signature is at most one hundred plus twice the count of edges of the other signature, and
            a higher count of faces of one signature is at most one hundred plus twice the count of faces of the other signature,
            considering that pair a candidate pair;
        calculating a similarity score between two bodies as a combination of ratios of the volumes of each body, volumes of bounding boxes of each body, entity counts of each body, and a prior-to-translation ratio of overlap volume of bounding boxes to a volume of a smaller bounding box between the bounding boxes of each body;
        sorting the candidate pairs based on their similarity scores;
        iterating through each candidate pair in decreasing order of similarity score and in which neither body is part of a candidate match, and identifying if a translation vector aligns the bodies of the pair by:
            representing each body as a point cloud of all vertices and centroids of edges and faces of the body; and
            finding a three-dimensional translation vector that aligns as many points as possible up to a configured tolerance by:
                within a randomly rotated coordinate system, for each of three axes projecting the two point clouds onto that axis and solving a resulting one-dimensional alignment problem by:

if either point cloud contains less than 100 points:
putting all pairwise differences into a vector, sorting the vector, and
identifying the value that appears most frequently as the best alignment;
if both point clouds contain 100 points or more:
sampling points from each cloud,
computing pairwise differences of the sampled points,
identifying differences that appear at least a certain number of times, and
testing on the full point clouds; and
identifying the three-dimensional translation vector as matching the pair when more than half of the points of the point clouds align;
if the translation vector is found, recording those pairs as a candidate match with the translation vector;
iterating a second time through each candidate pair in which neither body is part of a candidate match, and recording each candidate pair reached with both bodies not part of a candidate match as a candidate match with a zero translation vector; and
for each candidate match, transforming the body from the old model by the translation vector to align with the body from the new model;
matching overlapping topology of the old and the new models by finding underlying geometric curves and surfaces that are coincident between the old and the new models by:
matching vertices, edges, and faces of each pair of bodies in each candidate match by:
first identifying exact matches by:
using a three-dimensional grid-based near neighbor structure to identify pairs of edges and pairs of faces that have matching centroids; and
comparing topology within each pair of vertices, identified pair of edges, and identified pair of faces, and identifying the pair as a match when topology from the body of the new model coincides with topology from the body of the old model up to a configured tolerance;
then identifying matches based on overlap by:
for each pair of edges, one from the body of the new model and one from the body of the old model, with neither edge previously identified as a match, having identical curves:
computing an overlap length between the edge of the body of the old model and the edge of the body of the new model, and
if the overlap length is 80% or greater than a smaller length of the pair of edges, identifying the edges of the pair as matched;
for each edge of the body of the old model which is a line, circle, or ellipse, and not identified as matched:
computing a representation vector representation which is six-dimensional for lines, seven-dimensional for circles, and eleven-dimensional for ellipses, and
storing the representation vector in a dimensionally-equivalent (six-dimensional for lines, seven-dimensional for circles, and eleven-dimensional for ellipses) grid-based nearest neighbor structure;
for each edge of the body of the new model which is a line, circle, or ellipse, and not identified as matched:
looking up identical edges, within a configured tolerance, in the grid-based nearest neighbor structure for that edge type, repeating the look up additional times to account for ambiguity of direction or normalization;
for each identical edge found, if a bounding box of the edge of the body of the old model overlaps with a bounding box of the edge of the body of the new model:
computing an overlap length between the edge of the body of the old model and the edge of the body of the new model, and
if the overlap length is 80% or greater than a smaller length of the edges, identifying the edges as matched;
for each edge of the body of the new model not otherwise checked, comparing a bounding box of the edge with of a bounding box of each edge of the body of the new model which is not identified as matched, and if there is overlap between the compared bounding boxes:
computing an overlap length between the edge of the body of the old model and the edge of the body of the new model, and
if the overlap length is 80% or greater than a smaller length of the edges, identifying the edges as matched;
for each pair of faces, one from the body of the new model and one from the body of the old model, with neither face previously identified as a match, having identical surface topology:
computing an overlap area between the face of the body of the old model and the face of the body of the new model, and
if the overlap amount is 80% or greater than an area of the smaller of the pair of faces, identifying the faces of the pair as matched;
for each face of the body of the old model which is planar, cylindrical, conical, spherical, or toroidal, and not identified as matched:
computing a representation vector representation which is four-dimensional for planes, seven-dimensional for cylinders, seven-dimensional for cones, four-dimensional for spheres, and eight-dimensional for toroids, and
storing the representation vector in a dimensionally-equivalent grid-based nearest neighbor structure for the specific face type;
for each face of the body of the new model which is planar, cylindrical, conical, spherical, or toroidal, and not identified as matched:
looking up identical faces, within a configured tolerance, in the grid-based nearest neighbor structure for that face type;
for each identical face found, if a bounding box of the face of the body of the old model overlaps with a bounding box of the face of the body of the new model:
computing an overlap area between the face of the body of the old model and the face of the body of the new model, and
if the overlap area is 80% or greater than a smaller area of the faces, identifying the faces as matched; and then identifying matches based on adjacency by;
  assigning an arbitrary unique positive integer as a match index to each pair of matching vertices, matching edges, and matching faces;
  computing an adjacency signature as an adjacency signature array for each unmatched vertex, edge, and face of the body of the old model by:
    for each unmatched vertex, traversing adjacent edges and faces, and:
    for each edge or face which has a match index, recording that match index into the adjacency signature array;
    for each edge or face without a match index, recording a negative unmatched indicator into the adjacency signature array;
    if there is no face between two edges, recording a negative no-face indicator into the adjacency signature array; and
    rotating the adjacency signature array to retain the same traversal order but begin with the value that produces the greatest array when compared in lexicographical order;
    for each unmatched edge, traversing adjacent vertices and adjacent faces around the edge, and:
    for each vertex or face which has a match index, recording that match index into the adjacency signature array;
    for each vertex or face without a match index, recording a negative unmatched indicator into the adjacency signature array;
    if there is no face between two vertices, recording a negative no-face indicator into the adjacency signature array;
    rotating the adjacency signature array to retain the same traversal order but begin with the value that produces the greatest array when compared in lexicographical order;
    for each unmatched face:
    identifying all loops of the face;
    traversing all identified loops;
    during each loop traversal:
    computing a loop traversal array by:
    for each vertex or edge which has a match index, recording that match index into the loop traversal array; and
    for each vertex or edge without a match index, recording a negative unmatched indicator into the loop traversal array;
    rotating each loop traversal array to retain the same traversal order but begin with the value that produces the greatest array when compared in lexicographical order;
    sorting the loop traversal arrays in lexicographical order; and
    forming the adjacency signature array by concatenating the sorted loop traversal arrays with a negative loop separator indicator spliced between different loop traversal arrays;
  storing the adjacency signatures into a hash table;
  computing a new adjacency signature for each unmatched vertex, edge, and face of the body of the new model;
  ordering the new adjacency signatures into a queue based on ratio of matched to unmatched entities within each new adjacency signature;
  taking a top new adjacency signature from the queue and identifying any matching adjacency signature from the hash table;
  for matches from the hash table, identifying the vertex, edge, or face used to compute the adjacency signature as matching the vertex, edge, or face used to compute the new adjacency signature, and updating adjacency signatures of all adjacent and unmatched edges, faces, and vertices in both the old and new models;
  repeating until the queue is empty or no further matches are found between new adjacency signatures and the adjacency signatures in the hash table; and
  resolving references configured for the old model to apply features and constraints within the new model based on matched topology between the old and the new models.

2. A method within software operating computer aided design (CAD) comprising:
  importing a boundary representation (B-rep) of a CAD model as a new model;
  selecting an existing CAD model within the CAD software as an old model;
  computing one or more rigid motion transformations to align topology of the old model with topology of the new model;
  matching overlapping topology of the old and the new models by finding underlying geometric curves and surfaces that are coincident between the old and the new models; and
  resolving references configured for the old model to apply features and constraints within the new model based on matched topology between the old and the new models.

3. The method of claim 2, further comprising matching overlapping topology of the old and new models by near-neighbor data on a space of canonical representations of underlying geometric curves and surfaces.

4. The method of claim 2, further comprising matching topologically adjacent structures of the old and new models based on adjacency to topology already matched.

5. The method of claim 2, wherein computing one or more rigid motion transformations further comprises:
  identifying bodies within each model;
  computing a signature for each body such that similar bodies will have similar signatures;
  comparing between pairs of bodies taken one body from the old model and one body from the new model, and if signatures are similar considering that pairing a candidate pair;
  sorting the candidate pairs based on a similarity score;
  iterating through each candidate pair in decreasing order of similarity score and in which neither body is part of a candidate match, and identifying if a translation vector aligns the bodies of the pair, and if the translation vector is found, recording those pairs as a candidate match with the translation vector;
  iterating a second time through each candidate pair in which neither body is part of a candidate match, and recording each candidate pair reached with both bodies not part of a candidate match as a candidate match with a zero translation vector; and
  for each candidate match, transforming the body from the old model by the translation vector to align with the body from the new model.

6. The method of claim 5, wherein computing a signature for each body further comprises computing the signature as a vector of five numbers including a volume of the body, a diagonal length of an axis-aligned bounding box of the body, a number of vertices of the body, a number of edges of the body, and a number of faces of the body.

7. The method of claim 6, further comprising considering two signatures to be similar when their volumes are within a factor of ten of each other, their bounding box diagonals are within a factor of two of each other, a higher count of vertices of one signature is at most one hundred plus twice the count of vertices of the other signature, a higher count of edges of one signature is at most one hundred plus twice the count of edges of the other signature, and a higher count of faces of one signature is at most one hundred plus twice the count of faces of the other signature.

8. The method of claim 7, further comprising calculating the similarity score between two bodies as a combination of ratios of the volumes of each body, volumes of bounding boxes of each body, entity counts of each body, and a prior-to-translation ratio of overlap volume of bounding boxes to a volume of a smaller bounding box between the bounding boxes of each body.

9. The method of claim 5, wherein identify if a translation vector aligns the bodies of the pair further comprises:
representing each body as a point cloud of all vertices and centroids of edges and faces of the body; and
finding a three-dimensional translation vector that aligns as many points as possible up to a configured tolerance.

10. The method of claim 9, wherein finding a three-dimensional translation vector further comprises:
within a randomly rotated coordinate system, for each of three axes projecting the two point clouds onto that axis and solving a resulting one-dimensional alignment problem.

11. The method of claim 10, further comprising:
solving the resulting one-dimensional alignment problem by:
if either point cloud contains less than 100 points:
putting all pairwise differences into a vector,
sorting the vector, and
identifying the value that appears most frequently as the best alignment;
if both point clouds contain 100 points or more:
sampling points from each cloud,
computing pairwise differences of the sampled points,
identifying differences that appear at least a certain number of times, and
testing on the full point clouds; and
identifying the three-dimensional translation vector as matching the pair when more than half of the points of the point clouds align.

12. The method of claim 5, wherein matching further comprises matching vertices, edges, and faces of each pair of bodies in each candidate match by first identifying exact matches, and then identifying matches based on overlap, and then identifying matches based on adjacency.

13. The method of claim 12, wherein identifying exact matches further comprises:
using a three-dimensional grid-based near neighbor structure to identify pairs of edges and pairs of faces that have matching centroids; and
comparing topology within each pair of vertices, identified pair of edges, and identified pair of faces, and identifying the pair as a match when topology from the body of the new model coincides with topology from the body of the old model up to a configured tolerance.

14. The method of claim 12, wherein identifying matches based on overlap further comprises:

for each pair of edges, one from the body of the new model and one from the body of the old model, with neither edge previously identified as a match, having identical curves:
computing an overlap length between the edge of the body of the old model and the edge of the body of the new model, and
if the overlap length is 80% or greater than a smaller length of the pair of edges, identifying the edges of the pair as matched;
for each edge of the body of the old model which is a line, circle, or ellipse, and not identified as matched:
computing a representation vector representation which is six-dimensional for lines, seven-dimensional for circles, and eleven-dimensional for ellipses, and
storing the representation vector in a dimensionally-equivalent (six-dimensional for lines, seven-dimensional for circles, and eleven-dimensional for ellipses) grid-based nearest neighbor structure;
for each edge of the body of the new model which is a line, circle, or ellipse, and not identified as matched:
looking up identical edges, within a configured tolerance, in the grid-based nearest neighbor structure for that edge type, repeating the look up additional times to account for ambiguity of direction or normalization;
for each identical edge found, if a bounding box of the edge of the body of the old model overlaps with a bounding box of the edge of the body of the new model:
computing an overlap length between the edge of the body of the old model and the edge of the body of the new model, and
if the overlap length is 80% or greater than a smaller length of the edges, identifying the edges as matched;
for each edge of the body of the new model not otherwise checked, comparing a bounding box of the edge with of a bounding box of each edge of the body of the new model which is not identified as matched, and if there is overlap between the compared bounding boxes:
computing an overlap length between the edge of the body of the old model and the edge of the body of the new model, and
if the overlap length is 80% or greater than a smaller length of the edges, identifying the edges as matched;
for each pair of faces, one from the body of the new model and one from the body of the old model, with neither face previously identified as a match, having identical surface topology:
computing an overlap area between the face of the body of the old model and the face of the body of the new model, and
if the overlap amount is 80% or greater than an area of the smaller of the pair of faces, identifying the faces of the pair as matched;
for each face of the body of the old model which is planar, cylindrical, conical, spherical, or toroidal, and not identified as matched:
computing a representation vector representation which is four-dimensional for planes, seven-dimensional for cylinders, seven-dimensional for cones, four-dimensional for spheres, and eight-dimensional for toroids, and storing the representation vector in a dimensionally-equivalent grid-based nearest neighbor structure for the specific face type;

for each face of the body of the new model which is planar, cylindrical, conical, spherical, or toroidal, and not identified as matched:
  looking up identical faces, within a configured tolerance, in the grid-based nearest neighbor structure for that face type;
  for each identical face found, if a bounding box of the face of the body of the old model overlaps with a bounding box of the face of the body of the new model:
    computing an overlap area between the face of the body of the old model and the face of the body of the new model, and
    if the overlap area is 80% or greater than a smaller area of the faces, identifying the faces as matched.

15. The method of claim 12, wherein identifying matches based on adjacency further comprises:
  assigning an arbitrary unique positive integer as a match index to each pair of matching vertices, matching edges, and matching faces; and
  computing an adjacency signature for each unmatched vertex, edge, and face of the body of the old model.

16. The method of claim 15, wherein computing an adjacency signature for a vertex further comprises:
  traversing adjacent edges and faces around the vertex, and:
    for each edge or face which has a match index, recording that match index into an adjacency signature array;
    for each edge or face without a match index, recording a negative unmatched indicator into the adjacency signature array;
    if there is no face between two edges, recording a negative no-face indicator into the adjacency signature array; and
  rotating the adjacency signature array to retain the same traversal order but begin with the value that produces the greatest array when compared in lexicographical order.

17. The method of claim 15, wherein computing an adjacency signature for an edge further comprises:
  traversing adjacent vertices and adjacent faces around the edge, and:
    for each vertex or face which has a match index, recording that match index into an adjacency signature array;
    for each vertex or face without a match index, recording a negative unmatched indicator into the adjacency signature array;
    if there is no face between two vertices, recording a negative no-face indicator into the adjacency signature array; and
  rotating the adjacency signature array to retain the same traversal order but begin with the value that produces the greatest array when compared in lexicographical order.

18. The method of claim 15, wherein computing an adjacency signature for a face further comprises:
  identifying all loops of the face;
  traversing all identified loops;
  during each loop traversal:
    computing a loop traversal array by:
      for each vertex or edge which has a match index, recording that match index into the loop traversal array;
      for each vertex or edge without a match index, recording a negative unmatched indicator into the loop traversal array;
  rotating each loop traversal array to retain the same traversal order but begin with the value that produces the greatest array when compared in lexicographical order;
  sorting the loop traversal arrays in lexicographical order; and
  forming an adjacency signature array by concatenating the sorted loop traversal arrays with a negative loop separator indicator spliced between different loop traversal arrays.

19. The method of claim 15, further comprising:
  storing the adjacency signatures into a hash table;
  computing a new adjacency signature for each unmatched vertex, edge, and face of the body of the new model;
  ordering the new adjacency signatures into a queue based on ratio of matched to unmatched entities within each new adjacency signature;
  taking a top new adjacency signature from the queue and identifying any matching adjacency signature from the hash table;
  for matches from the hash table, identifying the vertex, edge, or face used to compute the adjacency signature as matching the vertex, edge, or face used to compute the new adjacency signature, and updating adjacency signatures of all adjacent and unmatched edges, faces, and vertices in both the old and new models; and
  repeating until the queue is empty or no further matches are found between new adjacency signatures and the adjacency signatures in the hash table.

* * * * *